(12) United States Patent
Bean, Jr. et al.

(10) Patent No.: US 11,805,624 B2
(45) Date of Patent: Oct. 31, 2023

(54) COOLANT SHROUD

(71) Applicant: Green Revolution Cooling, Inc., Austin, TX (US)

(72) Inventors: John Bean, Jr., Austin, TX (US); Jerry Mayfield, Austin, TX (US); Clay Baker, Leander, TX (US); Derek Gordon, Austin, TX (US)

(73) Assignee: Green Revolution Cooling, Inc., Austin, TX (US)

( * ) Notice: Subject to any disclaimer, the term of this patent is extended or adjusted under 35 U.S.C. 154(b) by 187 days.

(21) Appl. No.: 17/478,176

(22) Filed: Sep. 17, 2021

(65) Prior Publication Data

US 2023/0091814 A1 Mar. 23, 2023

(51) Int. Cl.
*H05K 7/20* (2006.01)

(52) U.S. Cl.
CPC ....... *H05K 7/2039* (2013.01); *H05K 7/20236* (2013.01); *H05K 7/20272* (2013.01)

(58) Field of Classification Search
CPC ............ H05K 7/2039; H05K 7/20236; H05K 7/20272
See application file for complete search history.

(56) References Cited

U.S. PATENT DOCUMENTS

| 2,643,282 A | 6/1953 | Greene |
| 3,094,133 A | 6/1963 | Treanor |
| 3,320,762 A | 5/1967 | Murdoch |
| 3,406,244 A | 10/1968 | Oktay |
| 3,450,265 A | 6/1969 | Kreusch et al. |
| 3,489,207 A | 1/1970 | Miller |

(Continued)

FOREIGN PATENT DOCUMENTS

| AU | 2009282170 B2 | 11/2014 |
| CN | 101443724 A | 5/2009 |

(Continued)

OTHER PUBLICATIONS

USPTO, International Search Report & Written Opinion, Application No. PCT/US2015/43468, dated Oct. 30, 2015 (11 pages).

(Continued)

*Primary Examiner* — Emmanuel E Duke
(74) *Attorney, Agent, or Firm* — THE MARBURY LAW GROUP, PLLC

(57) ABSTRACT

Various aspects include devices, systems, and methods for cooling a heatsink of electronic equipment immersed in an immersion coolant tank with a coolant shroud. The coolant shroud includes side walls and a covering wall. The side walls mounted on a mounting surface within the immersion coolant tank and on which the heatsink is secured and at least one of the side walls includes a fluid port. The covering wall extends from and between the side walls, wherein the side walls and the covering wall together form a cooling chamber that receives the heatsink. The covering wall includes a fluid aperture separate from the fluid port, wherein dielectric fluid inside the cooling chamber is in fluid communication with dielectric fluid outside the cooling chamber via the fluid aperture. The fluid port is in fluid communication with a dielectric fluid pump disposed outside the cooling chamber.

15 Claims, 5 Drawing Sheets

(56) References Cited

U.S. PATENT DOCUMENTS

| | | |
|---|---|---|
| 3,600,636 A | 8/1971 | Petersen |
| 3,754,741 A | 8/1973 | Whitehurst et al. |
| 3,858,090 A | 12/1974 | Lehmann |
| 4,034,335 A | 7/1977 | Harazoe et al. |
| 4,245,668 A | 1/1981 | Lindstrom |
| 4,302,793 A | 11/1981 | Rohner |
| 4,313,310 A | 2/1982 | Kobayashi et al. |
| 4,399,501 A | 8/1983 | Masselin |
| 4,460,008 A | 7/1984 | O'Leary et al. |
| 4,464,315 A | 8/1984 | O'Leary |
| 4,493,010 A | 1/1985 | Morrison et al. |
| 4,590,538 A | 5/1986 | Cray, Jr. |
| 4,600,230 A | 7/1986 | Yoji et al. |
| 4,648,043 A | 3/1987 | O'Leary |
| 4,659,459 A | 4/1987 | O'Leary et al. |
| 4,704,658 A | 11/1987 | Yokouchi et al. |
| 4,741,385 A | 5/1988 | Bergles et al. |
| 4,834,257 A | 5/1989 | Book et al. |
| 5,102,503 A | 4/1992 | Silinski et al. |
| 5,145,585 A | 9/1992 | Coke |
| 5,260,850 A | 11/1993 | Sherwood et al. |
| 5,294,916 A | 3/1994 | Bolton et al. |
| 5,297,621 A | 3/1994 | Taragi et al. |
| 5,329,418 A | 7/1994 | Tanabe |
| 5,332,494 A | 7/1994 | Eden et al. |
| 5,414,591 A | 5/1995 | Kimura et al. |
| 5,574,627 A | 11/1996 | Porter |
| 5,851,143 A | 12/1998 | Hamid |
| 5,907,473 A | 5/1999 | Przilas et al. |
| 6,019,167 A | 2/2000 | Bishop et al. |
| 6,374,627 B1 | 4/2002 | Schumacher et al. |
| D477,617 S | 7/2003 | Resch |
| 6,600,656 B1 | 7/2003 | Mori et al. |
| 6,616,851 B1 | 9/2003 | Sforza-Heinen et al. |
| 6,621,707 B2 | 9/2003 | Ishimine et al. |
| D483,045 S | 12/2003 | Resch |
| 6,909,606 B2 | 6/2005 | Barsun et al. |
| 7,086,247 B2 | 8/2006 | Campbell et al. |
| D530,346 S | 10/2006 | Resch |
| 7,184,269 B2 | 2/2007 | Campbell et al. |
| 7,210,304 B2 | 5/2007 | Nagashima et al. |
| 7,278,273 B1 | 10/2007 | Whitted et al. |
| 7,307,841 B2 | 12/2007 | Berlin et al. |
| 7,318,322 B2 | 1/2008 | Ota et al. |
| 7,403,392 B2 | 7/2008 | Attlesey et al. |
| 7,413,394 B2 | 8/2008 | Risser |
| 7,511,959 B2 | 3/2009 | Belady et al. |
| 7,511,960 B2 | 3/2009 | Hillis et al. |
| 7,551,971 B2 | 6/2009 | Hillis |
| 7,609,518 B2 | 10/2009 | Hopton et al. |
| 7,686,175 B2 | 3/2010 | Waisanen |
| 7,724,513 B2 | 5/2010 | Coglitore et al. |
| 7,724,517 B2 | 5/2010 | Attlesey et al. |
| 7,757,506 B2 | 7/2010 | Ellsworth, Jr. et al. |
| 7,843,298 B2 | 11/2010 | Hosokawa et al. |
| 7,854,652 B2 | 12/2010 | Yates et al. |
| 7,856,838 B2 | 12/2010 | Hillis et al. |
| 7,905,106 B2 | 3/2011 | Attlesey |
| 7,911,782 B2 | 3/2011 | Attlesey et al. |
| 7,911,793 B2 | 3/2011 | Attlesey |
| 7,934,386 B2 | 5/2011 | Rummel et al. |
| 7,961,463 B2 | 6/2011 | Belady et al. |
| 7,971,632 B2 | 7/2011 | Eriksen |
| 7,983,040 B2 | 7/2011 | Campbell et al. |
| 8,009,419 B2 | 8/2011 | Attlesey et al. |
| 8,047,904 B2 | 11/2011 | Yates et al. |
| 8,213,261 B2 | 7/2012 | Imhof et al. |
| 8,295,047 B1 | 10/2012 | Hamburgen et al. |
| 8,310,829 B2 | 11/2012 | Monk et al. |
| 8,654,529 B2 | 2/2014 | Attlesey |
| 8,817,465 B2 | 8/2014 | Campbell et al. |
| 9,049,800 B2 | 6/2015 | Shelnutt et al. |
| D744,996 S | 12/2015 | Keisling et al. |
| 9,386,727 B2 | 7/2016 | Barringer et al. |
| 9,504,190 B2 | 11/2016 | Best |
| 9,664,180 B2 | 5/2017 | Saavedra |
| D796,654 S | 9/2017 | Baker et al. |
| 9,756,766 B2 | 9/2017 | Best |
| D821,326 S | 6/2018 | Kreiner |
| 9,992,914 B2 | 6/2018 | Best et al. |
| 10,123,463 B2 | 11/2018 | Best et al. |
| 10,306,804 B2 | 5/2019 | Chester et al. |
| D852,936 S | 7/2019 | Baker et al. |
| 10,342,164 B2 | 7/2019 | So et al. |
| 10,405,457 B2 | 9/2019 | Boyd et al. |
| D875,206 S | 2/2020 | Gourgel et al. |
| 10,743,438 B2 | 8/2020 | Wakino et al. |
| 10,820,446 B2 | 10/2020 | Boyd et al. |
| 11,359,865 B2 | 6/2022 | Stone et al. |
| 11,516,943 B2 | 11/2022 | Bilan et al. |
| 2002/0014460 A1 | 2/2002 | McKay |
| 2002/0151799 A1 | 10/2002 | Pantages et al. |
| 2002/0185262 A1 | 12/2002 | Baer |
| 2002/0189173 A1 | 12/2002 | Staschik |
| 2003/0053293 A1 | 3/2003 | Beitelmal et al. |
| 2003/0127240 A1 | 7/2003 | Beckbissinger et al. |
| 2004/0008490 A1 | 1/2004 | Cheon |
| 2004/0013563 A1 | 1/2004 | Romer et al. |
| 2004/0050491 A1 | 3/2004 | Miya et al. |
| 2004/0223300 A1 | 11/2004 | Fink et al. |
| 2004/0246683 A1 | 12/2004 | Honsberg-Riedl et al. |
| 2004/0254682 A1 | 12/2004 | Kast |
| 2005/0011839 A1 | 1/2005 | Dart et al. |
| 2005/0024826 A1 | 2/2005 | Bash et al. |
| 2005/0052847 A1 | 3/2005 | Hamman |
| 2005/0083657 A1 | 4/2005 | Hamman |
| 2005/0111184 A1 | 5/2005 | Cliff et al. |
| 2005/0114876 A1 | 5/2005 | Atarashi et al. |
| 2005/0152112 A1 | 7/2005 | Holmes et al. |
| 2005/0259402 A1 | 11/2005 | Yasui et al. |
| 2006/0026610 A1 | 2/2006 | Sasao et al. |
| 2006/0064709 A1 | 3/2006 | Throckmorton et al. |
| 2006/0123436 A1 | 6/2006 | Tanaka et al. |
| 2006/0135042 A1 | 6/2006 | Frost et al. |
| 2006/0250755 A1 | 11/2006 | Tilton et al. |
| 2006/0274501 A1 | 12/2006 | Miller |
| 2007/0006599 A1 | 1/2007 | Kawamura et al. |
| 2007/0025081 A1 | 2/2007 | Berlin et al. |
| 2007/0034360 A1 | 2/2007 | Hall |
| 2007/0199340 A1 | 8/2007 | Knight et al. |
| 2007/0213000 A1 | 9/2007 | Day |
| 2007/0227710 A1 | 10/2007 | Belady et al. |
| 2007/0267741 A1 | 11/2007 | Attlesey et al. |
| 2008/0002364 A1 | 1/2008 | Campbell et al. |
| 2008/0017355 A1 | 1/2008 | Attlesey et al. |
| 2008/0026509 A1 | 1/2008 | Campbell et al. |
| 2008/0029250 A1 | 2/2008 | Carlson et al. |
| 2008/0030945 A1 | 2/2008 | Mojaver et al. |
| 2008/0055845 A1 | 3/2008 | Murakami et al. |
| 2008/0158818 A1 | 7/2008 | Cli et al. |
| 2008/0174954 A1 | 7/2008 | Mangilder et al. |
| 2008/0180908 A1 | 7/2008 | Wexler |
| 2008/0196868 A1 | 8/2008 | Attlesey et al. |
| 2008/0196870 A1 | 8/2008 | Attlesey et al. |
| 2008/0209931 A1 | 9/2008 | Stevens |
| 2008/0266726 A1 | 10/2008 | Murakami et al. |
| 2008/0270572 A1 | 10/2008 | Belady et al. |
| 2008/0273306 A1 | 11/2008 | Cambell et al. |
| 2009/0168345 A1 | 7/2009 | Martini |
| 2009/0229194 A1 | 9/2009 | Armillas |
| 2009/0251860 A1 | 10/2009 | Belady et al. |
| 2009/0260777 A1 | 10/2009 | Attlesey |
| 2009/0262455 A1 | 10/2009 | Merrow |
| 2009/0295167 A1 | 12/2009 | Clidaras et al. |
| 2010/0027212 A1 | 2/2010 | Armilas |
| 2010/0030267 A1 | 2/2010 | Winslow et al. |
| 2010/0061057 A1 | 3/2010 | Dersch et al. |
| 2010/0103618 A1 | 4/2010 | Campbell et al. |
| 2010/0139887 A1 | 6/2010 | Slessman |
| 2010/0165565 A1 | 7/2010 | Hellriegal et al. |
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |

(56) References Cited

U.S. PATENT DOCUMENTS

| | | |
|---|---|---|
| 2010/0290190 A1 | 11/2010 | Chester et al. |
| 2010/0302678 A1 | 12/2010 | Merrow |
| 2011/0075353 A1 | 3/2011 | Attlesey et al. |
| 2011/0103019 A1 | 5/2011 | Levi et al. |
| 2011/0120885 A1 | 5/2011 | Miller et al. |
| 2011/0132579 A1 | 6/2011 | Best et al. |
| 2011/0134604 A1 | 6/2011 | Attlesey |
| 2011/0151765 A1 | 6/2011 | Chen et al. |
| 2011/0157829 A1 | 6/2011 | Wormsbecher et al. |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1 | 7/2012 | Dunnavant |
| 2012/0236487 A1 | 9/2012 | Wallace et al. |
| 2012/0294737 A1 | 11/2012 | Singh et al. |
| 2012/0300391 A1 | 11/2012 | Keisling et al. |
| 2013/0025888 A1 | 1/2013 | Eckholm et al. |
| 2013/0032217 A1 | 2/2013 | Pesek et al. |
| 2013/0075066 A1 | 3/2013 | Reyblat |
| 2013/0105139 A1 | 5/2013 | Campbell et al. |
| 2013/0146273 A1 | 6/2013 | Chester et al. |
| 2014/0060773 A1 | 3/2014 | Wajima |
| 2014/0060799 A1 | 3/2014 | Eckberg et al. |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0211412 A1 | 7/2014 | Best |
| 2014/0216686 A1 | 8/2014 | Shelnutt et al. |
| 2014/0218858 A1 | 8/2014 | Shelnutt et al. |
| 2014/0301037 A1 | 10/2014 | Best |
| 2014/0307384 A1 | 10/2014 | Best |
| 2014/0362527 A1 | 12/2014 | Best |
| 2015/0048950 A1 | 2/2015 | Zeighami et al. |
| 2015/0138723 A1 | 5/2015 | Shedd et al. |
| 2015/0181762 A1 | 6/2015 | Boyd et al. |
| 2015/0276292 A1 | 10/2015 | Son et al. |
| 2015/0305209 A1 | 10/2015 | Inaba et al. |
| 2015/0334880 A1 | 11/2015 | Best |
| 2016/0234970 A1 | 8/2016 | Shelnutt et al. |
| 2017/0142868 A1 | 5/2017 | Chen et al. |
| 2017/0265328 A1 | 9/2017 | Sasaki et al. |
| 2017/0303443 A1 | 10/2017 | Inano et al. |
| 2017/0332514 A1 | 11/2017 | Saito |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2019/0387641 A1 | 12/2019 | Aoki et al. |
| 2020/0323108 A1 | 10/2020 | Bilan et al. |
| 2021/0368656 A1 | 11/2021 | Heydari |
| 2021/0382533 A1 | 12/2021 | Heydari |
| 2022/0220976 A1 | 7/2022 | Perevozchikov et al. |

FOREIGN PATENT DOCUMENTS

| | | | | |
|---|---|---|---|---|
| CN | 109874275 A | * | 6/2019 | |
| GB | 8201450000-2000 | | 5/2022 | |
| JP | 2004319628 | | 11/2004 | |
| JP | 2004363308 | | 12/2004 | |
| JP | 2011-518395 A | | 6/2011 | |
| JP | 2018019038 A | | 2/2018 | |
| JP | 2019161201 A | | 9/2019 | |
| JP | 2021-519978 A | | 8/2021 | |
| WO | 2007023130 A1 | | 3/2007 | |
| WO | 2007098078 A2 | | 8/2007 | |
| WO | 2008027931 A2 | | 3/2008 | |
| WO | 2008089322 A2 | | 7/2008 | |
| WO | 2010019517 A1 | | 2/2010 | |
| WO | WO-2010019517 A1 | * | 2/2010 | ............ F28D 15/00 |
| WO | 2013022805 A1 | | 2/2013 | |
| WO | WO-2019061721 A1 | * | 4/2019 | ......... H05K 7/20272 |
| WO | 2020-234600 A1 | | 11/2020 | |

OTHER PUBLICATIONS

Canadian Intellectual Property Office, Office Action, Canadian Application No. 2,731,994, dated Dec. 3, 2015 (6 pages).
USPTO, Non-final Office Action, U.S. Appl. No. 14/251,014, dated Dec. 4, 2015 (13 pages).
USPTO, Non-Final Office Action, U.S. Appl. No. 14/271,386, dated Dec. 17, 2015, (17 pages).
USPTO, Non-final Office Action, U.S. Appl. No. 14/245,978, dated Jan. 13, 2016 (33 pages).
Andre Bakker, "Modeling Flow Fields in Stirred Tanks," 2006, (40 pages).
Hernandez, "Will IT Managers Warm to Liquid-Cooled Servers?" Dec. 8, 2009 (3 pages).
European Patent Office, Examination Report, Communication pursuant to Article 94(3) EPC, dated Nov. 26, 2018, for European Patent Application No. 09807136.8 from the European Patent Office, (13 pages).
Korean Intellectual Property Office, International Search Report and Written Opinion in International Application No. PCT/US2021/058991 dated Mar. 3, 2022 (10 pages).
"Disruptive Technologies," SC10 Disruptive Technologies, Retrieved from http://sc10supercomputing.org/index-pg=disrupttech.html, Nov. 13-19, 2010, 8 pages.
Extended European Search Report for European Application No. 09807136.8, dated Jun. 6, 2017, 12 Pages.
Intel, "Intel® Pentium® 4 Processor on 90 nm Process," Datasheet, Feb. 2005, pp. 64-65.
International Preliminary Report on Patentability, Application No. PCT/US2014/037005, dated Nov. 19, 2015, 12 pages.
International Preliminary Report on Patentability for International Application No. PCT/US2009/053305, dated Feb. 24, 2011, 19 pages.
International Preliminary Report on Patentability for International Application No. PCT/US2015/030618, dated Nov. 24, 2016, 10 pages.
International Search Report and Written Opinion for International Application No. PCT/US2014/033081, dated Aug. 27, 2014, 9 pages.
Office Action for Chinese Application No. 200980131707.3, dated Jul. 31, 2013, 8 pages.
Park J, "New Cooling Strategies for Greater Data Center Energy Efficiency," Facebook, Nov. 4, 2010, 4 pages.
Supplementary Examination Report for Singapore Application No. 11202000306X, dated Nov. 18, 2022, 4 pages.
U.S. Appl. No. 13/057,881, filed Feb. 7, 2011, Christiaan Scott Best, 72 pages.
U.S. Appl. No. 14/667,091, filed Mar. 24, 2015, Christiaan Scott Best, 65 pages.
GRC ICE Immersion Cooling Solutions Brochure, published Jun. 2018 [online] [site visited Jul. 25, 2022] internet URL:https://www.grcooling.com/wp-content/uploads/2018/06/GRC_ICE_Product_Brochure.pdf (2018).
GRC ICEraQ® Series 10 Launch Event Presentation, published Dec. 27, 2021 [online] [site visited Jul. 25, 2022] Internet URL:https://digitalinfranetwork.com/videos/655447036-2 (2021).
ICEraQ 10 Quad Duo-SPecification Sheet, published 2021 [online] [site visited Jul. 25, 2022] Internet URL:https://www.grcooling.com/wp-content/uploads/2018/06/GRC_Data_Sheet_ICEraQ_Quad-Duo-One.pdf (2021).
GRC® Releases the Next Generation of Data Center Liquid Immersion Cooling, Providing Increased Sustainability Capable of Delivering a PUE Yield of <1.03 and a Significant Reduction in Operating Costs, published May 18, 2021 [online] [site visited Jul. 25, 2022] (2021) Internet URL: https://www.businesswire.com/news/home/20210518005857/en/GRCE%C2%AE-Releases-the-Next-Generation-of-Delivering-a-PUE-Yield-of-1.03-and-a-Signifcant-Reduction-in-Operating-Costs (2021).
International Search Report and Written Opinion of the International Searching Authority received from the Korean Intellectual Property Office in related International Application No. PCT/US2022/043817 dated Jan. 10, 2023.
Intel Core 2 Duo Processor on 65 nm Process for Empedded

(56) References Cited

OTHER PUBLICATIONS

Applications, Aug. 2007, Intel, pp. 1, 14 and 21 (3 Pages).
Canadian Intellectual Property Office, Office Action dated Nov. 8, 2016, for Canadian Patent Application No. 2,731,994 related to National Phase of Application No. PCT/US2009/053305 filed Aug. 10, 2009 (4 pages).
Miller, Rich, "Data Center Used to Heat Swimming Pool," Apr. 2, 2008, retrieved from the Internet: URL:https://www.datacenterknowledge.com/archives/2008/04/02/data-center-used-to-heat-swimming-pool [retrieved on Nov. 13, 2018](2 pages).
"Green Revolution Cooling Named Disruptive at SC'09," Press Release, Aug. 3, 2009, Austin, TX (1 page).
USPTO, International Search Report and Written Opinion dated Oct. 14, 2009, Application No. PCT/US2009/053305 (17 pages).
"Disruptive Technologies", Super Computing, Nov. 14-20, 2009, Oregon Convention Center, Portland, Oregon (2 pages).
Hernandez, "Are Liquid-Cooled Servers Coming to a Data Center Near you?", Clean Tech, Dec. 4, 2009 (2 pages).
"Green Revolution Cooling Named a Disruptive Technology of the Year at SC'10," Press Release, Nov. 1, 2010, New Orleans, LA (1 page).
Miarkoff, "Data Centers' Power Use Less Than was Expected," The New York Times, Jul. 31, 2011, (3 pages).
Danish Patent and Trademark Office Singapore, Written Opinion and Search Report for Application No. 201100595-6, dated Apr. 16, 2012, Singapore. (20 pages).
Danish Patent and Trademark Office, Singapore Written Opinion and Search Report dated May 2, 2012, Application No. 201100595-6, (21 pages).
USPTO, International Search Report and Written Opinion from PCT/US2012/49668 dated Oct. 19, 2012. (10 pages).
China National Intellectual Property Administration, Office Action from Chinese Application No. 200980131707.3, dated Dec. 20, 2012, including English-language translation, (17 pages).
USPTO, Office Action from U.S. Appl. No. 13/057,881, dated Jun. 4, 2013, (13 pages).
People's Republic of China, Office Action issued in corresponding Chinese Application No. 200980131707.3 dated Jul. 31, 2013, including English-language Translation (3 pages).
IP Australia, Examination Report from Australian Application No. 2009282170, dated Nov. 15, 2013, (3 pages).
"The Green 500 List—Nov. 2013," The Green 500, Nov. 20, 2013, (3 pages) [http://www.green500.org] (3 pages).
USPTO, Final Office Action from U.S. Appl. No. 13/057,881, dated Nov. 22, 2013 (13 pages).
People's Republic of China, Office Action issued in corresponding Chinese Application No. 200980131707.3 dated Dec. 20, 2013, incl. English Translation (8 pages).
USPTO, Applicant-Initiated Interview Summary from U.S. Appl. No. 13/057,881, dated Feb. 25, 2014 (4 pages).
People's Republic of China, Office Action issued in corresponding Chinese Application No. 200980131707.3 dated Apr. 3, 2014, English Translation (pp. 13).
USPTO, Office Action from U.S. Appl. No. 13/057,881, dated Apr. 11, 2014 (16 pages).
People's Republic of China, Office Action issued in corresponding Application No. 200980131707.3 dated Apr. 18, 2014, incl. English Translation (7 pages).
USPTO, International Search Report & Written Opinion, Application No. PCT/US2014/17835, dated Jun. 13, 2014 (9 pages).
IP Australia, Patent Examination Report No. 2 from Australian Application No. 200928170 dated Jun. 18, 2014 (4 pages).
USPTO, Applicant-Initiated Interview Summary from U.S. Appl. No. 13/057,881, dated Jul. 1, 2014 (3 pages).
U.S. Appl. No. 14/338,013, filed Jul. 22, 2014, Christian Scott Best (60 pages).
U.S. Appl. No. 14/338,020, filed Jul. 22, 2014, Christian Scott Best (60 pages).
U.S. Appl. No. 14/338,026, filed Jul. 22, 2014, Christian Scott Best (60 pages).
U.S. Appl. No. 14/338,035, filed Jul. 22, 2014, Christian Scott Best (60 pages).
USPTO, International Preliminary Report on Patentability, Application No. PCT/US2014/033081, dated Aug. 27, 2014 (9 pages).
USPTO, International Search Report & Written Opinion, Application No. PCT/US2014/33834, dated Sep. 15, 2014 (16 pages).
USPTO, International Search Report & Written Opinion, Application No. PCT/US2014/037005, dated Sep. 24, 2014 (18 pages).
Lee, Si Young, et al, "Hydraulics and Mixing Evaluations for NT-21/41 Tanks," Oct. 2014 (32 pages).
USPTO, Applicant-Initiated Interview Summary from U.S. Appl. No. 13/057,881, dated Oct. 9, 2014 (3 pages).
USPTO, Final Office Action from U.S. Appl. No. 13/057,881, dated Nov. 3, 2014 (23 pages).
IP Australia, Notice of Acceptance, Australian Application No. 2009282170, dated Nov. 14, 2014 (2 pages).
The State Intellectual Property of the Preople's Republic of China, Office Action from Chinese Application No. 200980131707.3, dated Dec. 31, 2014, English and Chinese versions, (10 pages).
USPTO, Office Action from U.S. Appl. No. 13/057,881, dated Jan. 9, 2015 (3 pages).
USPTO, Office Action from U.S. Appl. No. 13/057,881, dated Mar. 3, 2015 (20 pages).
"Intel Xeon Processor E7-4800/8800 v3 Product Families", May 2015, p. 46 (1 page).
Substantive Examination Adverse Report, Malaysian Application No. PI2011000494, dated May 15, 2015 (3 pages).
USPTO, Non-final Office Action in corresponding U.S. Appl. No. 14/667,091 dated May 22, 2015, (30 pages).
USPTO, Final Office Action in U.S. Appl. No. 13/057,881, dated Jun. 16, 2015, (30 Pages).
European Patent Office, Supplemental Search Report, European Application No. 12821634.8, dated Jul. 15, 2015 (6 pages).
USPTO, International Search Report & Written Opinion, Application No. PCT/US2015/30618, dated Aug. 5, 2015, (12 pages).
International Search Report & Written Opinion, Application No. PCT/US2015/30618, dated Aug. 27, 2015, (12 pages).
USPTO, Non-Final Office Action, U.S. Appl. No. 14/237,100, dated Sep. 30, 2015, (21 pages).
China National Intellectual Property Administration, Office Action, Chinese Application No. 201280049039.1, dated Oct. 27, 2015 (33 pages).
International Search Report and Written Opinion for International Application No. PCT/US2023/016342, dated Jul. 13, 2023, 8 pages.

* cited by examiner

COOLANT SHROUD

BACKGROUND

Immersion cooling racks provide a bath of dielectric fluid in a tank. Computer servers or other electronic equipment may be mounted on immersion cooling racks within the tank. The dielectric fluid may be circulated around computer servers or other electronic equipment such that heat can be rejected from one or more computer servers or other electronic equipment mounted within the tank. While the flow of the dielectric fluid in and around the heat-generating electronic equipment immersed in the tank helps remove heat from the electronic equipment generally, providing adequate localized cooling to some of the most intensive heat-generating elements of the electronic equipment, such as CPUs and GPUs, remains challenging. The surfaces of those intensive heat-generating elements tend to have dense (i.e., small pitch) fin patterns that make achieving heat transfer velocity targets difficult. Additionally, pressure losses of side stream flow channels may be lower than pressure losses of specific heat transfer surfaces, thereby allowing adverse amounts of bypass flow of dielectric cooling fluids.

SUMMARY

Various aspects include devices, systems, and methods for cooling a heatsink of electronic equipment immersed in an immersion coolant tank. The devices and systems may include a coolant shroud comprising side walls and a covering wall. The side walls may be configured to be mounted on a mounting surface within the immersion coolant tank and on which the heatsink is secured, wherein the side walls are configured to extend away from the mounting surface. At least one of the side walls may include a fluid port. The covering wall extends from and between the side walls, wherein the side walls and the covering wall together form a cooling chamber configured to receive the heatsink therein. The covering wall includes a fluid aperture separate from the fluid port, wherein dielectric fluid inside the cooling chamber is in fluid communication with dielectric fluid outside the cooling chamber via the fluid aperture. Also, the fluid port may be in fluid communication with a dielectric fluid pump disposed outside the cooling chamber such that fluid pressure generated by the dielectric fluid pump is configured to move dielectric fluid through and between each of the fluid aperture and the fluid port.

In some embodiments, the fluid aperture may be formed as an elongate slot disposed at an opposite end of the covering wall from a side wall of the side walls that includes the fluid port. The fluid aperture and the fluid port may be configured to enable the dielectric fluid pump to draw dielectric fluid from the immersion coolant tank into the cooling chamber through the fluid aperture for cooling the heatsink and return to the immersion coolant tank via the fluid port. The fluid aperture and the fluid port may be disposed on opposite side walls. The heatsink may be disposed between the covering wall and the mounting surface. Inside the immersion coolant tank, the covering wall may be configured to be mounted in a vertical orientation and the fluid port is disposed in a downward facing orientation.

Some embodiments may include tubing coupling the fluid port to the dielectric fluid pump. The dielectric fluid pump may be contained within the dielectric fluid tank and remote from the side walls and covering wall and contained within the dielectric fluid tank. The dielectric fluid pump may be a venture ejector pump configured to receive and combine a motivating fluid flow with a flow of dielectric fluid drawn from the fluid port of the coolant shroud.

BRIEF DESCRIPTION OF THE DRAWINGS

The accompanying drawings, which are incorporated herein and constitute part of this specification, illustrate exemplary embodiments of the claims and together with the general description given above and the detailed description given below, serve to explain the features of the claims.

DETAILED DESCRIPTION

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

Various embodiments enhance flow rates to specific elements of electronic equipment and include techniques and specific geometries that will help facilitate significant power handling increases in components within immersion cooling tanks. Localized enhanced flow rate(s) in a server may individually or in aggregate be less than, equal to, or greater than bulk flow rate through the server. In some cases, localized enhanced flow rates may improve performance at greater volumetric rates than the bulk flow through the server; i.e., where the specific heat capacity of server bulk flow is sufficient to address appropriate net temperature changes, but other properties of the fluid (e.g., higher viscosity) may need the flow to be enhanced to improve local heat transfer coefficients.

Certain locations on electronic equipment, such as a server, namely the central processing unit (CPU), require additional cooling compared to the rest of the architecture. This may be due to the CPU being the most intensive heat generating element. However, sizing the entire fluid circulation system around providing adequate flow across the CPU for cooling purposes is generally impractical. Thus, various embodiments include a dedicated dielectric fluid pump and coolant shroud to promote additional flow over the CPU and heatsink. The coolant shroud may be a shaped plastic containment system that separates fluid flow near the CPU and heatsink from the bulk fluid.

Various embodiments disclosed herein include a coolant shroud for a heatsink of electronic equipment immersed in an immersion coolant tank. The coolant shroud includes side walls and a covering wall. The side walls may be configured to be mounted on a mounting surface within the immersion coolant tank and on which the heatsink is secured. Also, the side walls may be configured to extend away from the mounting surface, wherein at least one of the side walls includes a fluid port. The covering wall may extend from and between the side walls such that the side walls and the covering wall together form a cooling chamber configured to receive the heatsink therein. The covering wall may include a fluid aperture separate from the fluid port. Dielectric fluid inside the cooling chamber may be in fluid communication with dielectric fluid outside the cooling chamber via the fluid aperture. In addition, the fluid port may be in fluid communication with a dielectric fluid pump disposed outside the cooling chamber and configured to move dielectric fluid through each of and between the fluid aperture and the fluid port.

Figure 1:
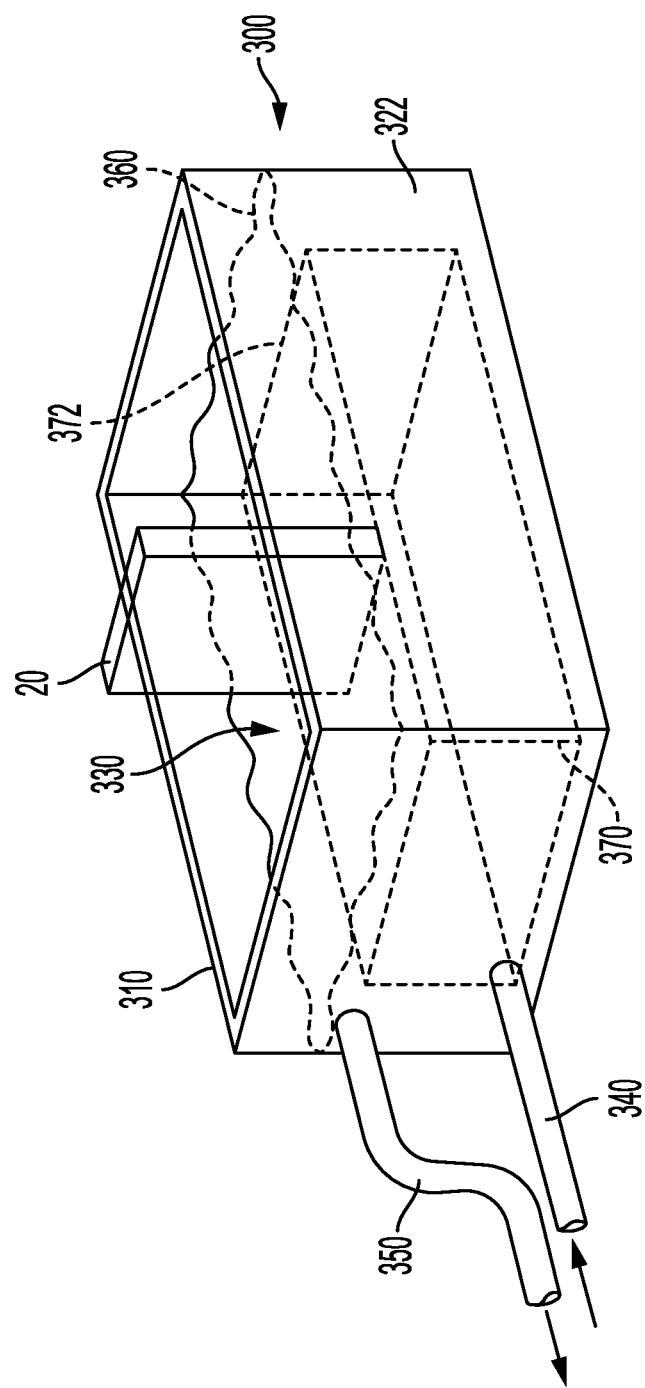
FIG. 1 a perspective view of an immersion cooling system in accordance with various embodiment.

FIG. 1 illustrates various aspects of an immersion coolant system 300 for immersing a rack of electronic equipment, such as independently operable servers, in a dielectric fluid 322 is depicted. The immersion coolant system 300 may include an immersion coolant tank 310 and mounting members for mounting computer servers or other electronic equipment, as will be described in more detail hereinafter. The immersion coolant tank 310 may be fabricated of steel, a sufficiently strong plastic that is compatible with the dielectric liquid coolant used as a cooling medium, or other suitable material. The immersion coolant tank 310 may face upward with an open top 330 to form an open interior volume and may be shaped to have a length L, width W, and height H with the minimum footprint to insert multiple pieces of electronic equipment 20 (e.g., servers). Suitable mounting members may be used to mount the electronic equipment 20 in the immersion coolant tank 310 to form the server rack 370 therein. The immersion coolant tank 310 may be shaped, dimensioned, and sized such that multiple standard-sized pieces of electronic equipment 20 (e.g., servers) can be supported without significant modification.

The immersion coolant tank 310 may be fabricated to have an inlet pipe or line 340 from a piping system connected to a heat exchanger for the flow of lower temperature or cooled liquid coolant into the immersion coolant tank 310 and an outlet pipe or line 350 connected to collection piping for the flowing or pumping of heated coolant out of the immersion coolant tank 310 to an external heat exchanger associated with one or more heat-rejection or cooling systems.

The server rack 370 may have a number of different implementations. Preferably, the mounting members are configured to receive the multiple pieces of electronic equipment 20 (e.g., servers) in a vertical orientation, thereby minimizing the footprint of the multiple pieces of electronic equipment 20 (e.g., servers) relative to the ground, and with the "front" panel facing upward for easy installation and removal of a server without the need to remove or disturb any other server within the immersion coolant tank 310.

The mounting members may be also configured to mount each of the multiple pieces of electronic equipment 20 (e.g., servers) such that the top level 360 of the dielectric coolant completely submerges the top level 372 of the server rack 370 formed by the multiple pieces of electronic equipment 20 (e.g., servers). As a consequence, a volume of liquid coolant collects in a common area above the server rack 370 to improve the circulation of the liquid coolant through the multiple pieces of electronic equipment 20 (e.g., servers), thereby enhancing the cooling of each respective piece of electronic equipment 20. The mounting members may also be configured to mount the multiple pieces of electronic equipment 20 (e.g., servers) in the server rack 370 above the bottom of the immersion coolant tank 310 to create a volume of liquid coolant between each respective server and the bottom of the immersion coolant tank 310 such that the flow of the dielectric liquid coolant through the servers is improved.

Figure 2:
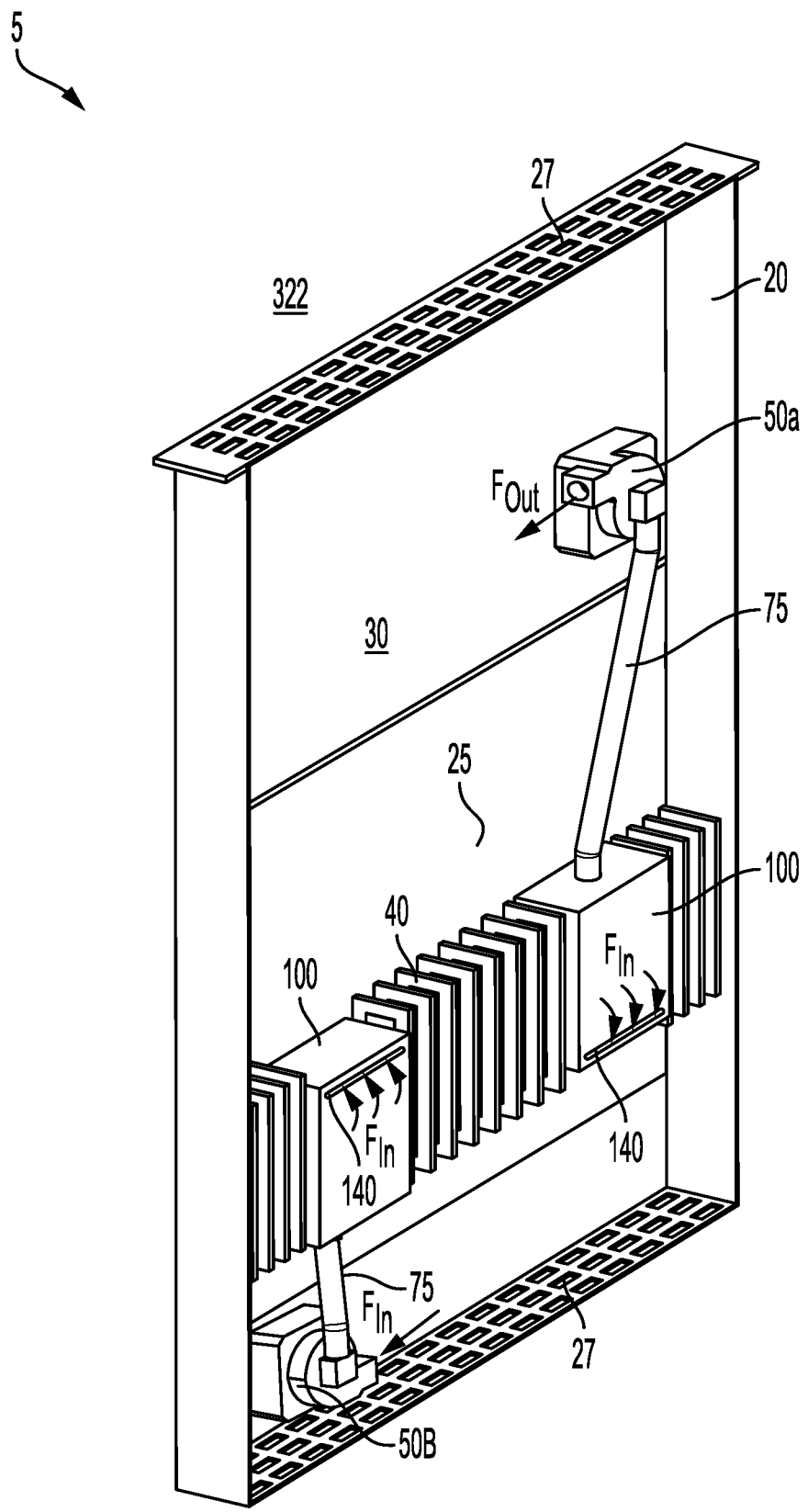
FIG. 2 is a perspective view of an electronic equipment coolant system with an electronic equipment case submerged in dielectric fluid in an immersion coolant tank in accordance with various embodiments.

FIG. 2 illustrates various aspects of an electronic equipment coolant system 5 with a coolant shroud 100 used to cool the heatsink elements of electronic equipment 20 submerged in dielectric fluid 322 in an immersion coolant tank 310, in accordance with various embodiments. The various embodiments are described herein with regard to a system for enhancing flow rates of dielectric fluid to specific elements of electronic equipment, such as heatsinks, in an immersion coolant tank 310.

Various embodiments apply to immersion cooling tanks that hold electronic equipment 20 (e.g., computer servers) therein. Each element of electronic equipment 20 may include one or more dual in-line memory modules (DIMMs) 40, some of which may be contained within a coolant shroud 100. The coolant shroud 100 may be coupled with tubing 75 to a dielectric fluid pump 50 for redirecting dielectric fluid specifically onto and over heatsinks (e.g., 80 in FIG. 4) or particular fins 81 of the heatsink housed within the coolant shroud 100.

In FIG. 2, the electronic equipment 20 is illustrated as having one side removed, as well as several components thereof, to more clearly explain aspects of the various embodiments. The electronic equipment 20 may include upper and lower screens 27 configured to allow the flow of dielectric fluid 322 from the immersion coolant tank 310 to flow in and out thereof. An inner volume 30 of the electronic equipment 20 houses the DIMMs 40 and heatsinks (e.g., 80 in FIG. 4), which may be mounted on a mounting surface 25, such as a printed circuit board supporting additional elements, within the electronic equipment 20. Alternatively, or additionally, the screens 27 may be included on all or part of the lateral sides of the electronic equipment 20, such as a lower portion of the lateral sides to take advantage of cooler dielectric fluid flowing near the bottom of the immersion coolant tank 310.

The DIMMs 40 illustrated in FIG. 2 include two cooling shroud 100 that each enclose a heatsink (e.g., 80 in FIG. 4), however fewer or greater heatsinks and corresponding cooling shrouds 100 may be provided. Each cooling shroud 100 may be configured to direct at least a portion of the flow of dielectric coolant 322 in the inner volume 30 specifically over other heat producing electronics (e.g., a DIMM, Power Supply, etc.) contained therein. A dielectric fluid pump 50a, also disposed in the electronic equipment 20, may provide a suction force, via tubing 75, to create an in-flow $F_{In}$ into the cooling shroud 100 and redirect dielectric coolant with an out-flow $F_{Out}$ to another part of the inner volume 30. The coolant shroud 100 may include a coolant aperture 140, which is where the dielectric coolant is suctioned in and over the heatsink, and a fluid port to the tubing 75 for expelling the dielectric coolant after it has absorbed heat generated by the heatsink. Alternatively, one dielectric fluid pump 50a may provide the suction pressure to more than one coolant shroud 100. As a further alternative, each coolant shroud 100 may have more than one dielectric fluid pump 50 providing the suction pressure thereto. As yet a further alternative, the dielectric fluid pump 50b may provide a pushing force, via tubing 75, to create an in-flow and an out-flow opposite to that illustrated. As yet a further alternative, one dielectric fluid pump 50a may provide a suction force, while another dielectric fluid pump 50*b* may provide a pushing force. While FIG. 2 is illustrated with a pulling pump 50*a* and a pushing pump 50*b*, embodiments within the contemplated scope of disclosure may include one pump, two pumps or more pumps. Moreover, in embodiments that include two or more pumps, the pumps (50*a*, 50*b*) may be the same type or different types (i.e., push or pull).

The piece of electronic equipment 20 (e.g., server) may be oriented with its lengthwise extent in a vertical direction, such that multiple cases may hang next to one another on a cooling rack of an immersion coolant tank. Additional cases may hang to the left and/or right of the piece of electronic equipment 20 as illustrated. Due to the vertical orientation, gravity may aid in pulling the dielectric fluid through the coolant aperture 140 located near a bottom of the coolant shroud 100, since the heated dielectric fluid will have a lower density and tend to rise (i.e., move vertically upward) within the inner volume 30. In this way, the position of the coolant shroud and the relative orientation of the coolant aperture 140 may leverage convection currents of the dielectric fluid within the inner volume 30 to improve coolant flow.

Figure 3:
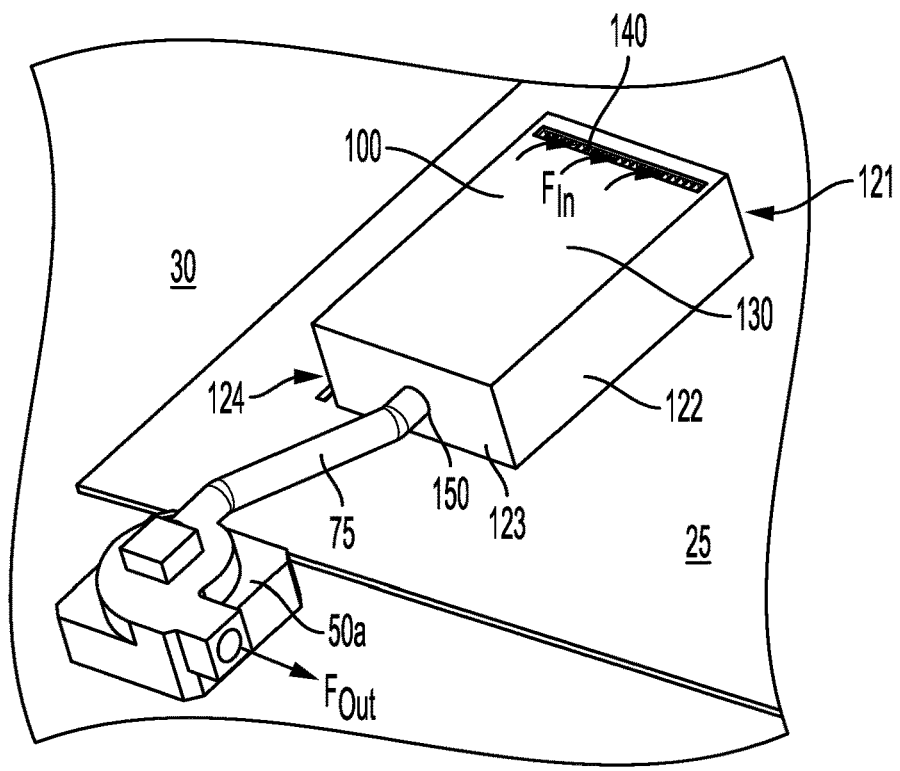
FIG. 3 is a close-up isolation view of a coolant shroud and dielectric coolant pump coupled through tubing, from FIG. 2, in accordance with various embodiments.

FIG. 3 is a close-up isolated view of the coolant shroud 100 and dielectric coolant pump 50*a* coupled through tubing 75. The coolant shroud 100 includes side walls 121, 122, 123, 124 and a covering wall 130. The side walls 121, 122, 123, 124 may be configured to be mounted on the mounting surface 25 within the immersion coolant tank and on which the heatsink may be secured. In particular, the mounting surface 25 may be located in the inner volume 30 of the case (e.g., for corresponding electronic equipment. The side walls 121, 122, 123, 124 may be configured to extend away from the mounting surface 25. Also, at least one of the side walls may include a fluid port 150 to which the tubing 75 may be coupled. The covering wall 130 extends from and between the side walls 121, 122, 123, 124 so together the side walls 121, 122, 123, 124 and the covering wall 130 form a cooling chamber underneath. The cooling chamber may be configured to receive the heatsink therein. In particular, the heatsink may be disposed between the covering wall 130 and the mounting surface 25. In addition, a central processing unit (CPU) may actually be disposed under the heatsink (i.e., between the heatsink and the mounting surface 25) and even a thermal interface material may further be disposed between the heatsink and the CPU.

The covering wall 130 may include the fluid aperture 140 separate from the fluid port 150. The fluid aperture 140 may provide dielectric fluid inside the cooling chamber with a means of fluid communication with dielectric fluid outside the cooling chamber (i.e., via the fluid aperture 140). In contrast, the fluid port 150 may be in fluid communication with the dielectric fluid pump 50 disposed outside the coolant shroud 100, and thus outside the cooling chamber. Fluid pressure generated by the dielectric fluid pump 50*a* may be configured to move dielectric fluid 322 through and between each of the fluid aperture 140 and the fluid port 150.

In various embodiments, the fluid aperture 140 may be formed as an elongate slot disposed at an opposite end of the covering wall 130 from the side wall 123 that includes the fluid port 175. The fluid aperture 140 and the fluid port 150 may be configured to enable the dielectric fluid pump 50*a* to generate a suction pressure that draws dielectric fluid from the immersion coolant tank (i.e., the inner volume 30) into the cooling chamber through the fluid aperture 140 for cooling the heatsink and return to the immersion coolant tank via the fluid port. In this way, the in-flow $F_{In}$ of dielectric fluid enters the fluid aperture 140 and dielectric fluid exits the fluid port 150, directed toward an intake of the dielectric fluid pump 50*a*, and eventually exits the dielectric fluid pump 50*a* as an out-flow $F_{Out}$.

The tubing 75, which couples the fluid port 150 to the dielectric fluid pump 50, may enable dielectric fluid to be directed to a remote section of the inner chamber 30 so cooler dielectric fluid remains near the coolant shroud 100. Thus, even though the dielectric fluid pump 50*a* and the coolant shroud 100 are contained within the same dielectric fluid tank, they may be remote from one another. In this way, the dielectric fluid pump 50*a* may be remote from the side walls 121, 122, 123, 124 and covering wall 130. While FIG. 3 illustrates the dielectric fluid pump 50*a* and shroud operating in a pull type manner (i.e., the dielectric fluid is drawn into the coolant shroud 100 through the fluid aperture 140), the same components may be operated in a push type manner in which cool dielectric fluid 322 may enter into the dielectric fluid pump (i.e., 50*b*) and be pushed through tube 75 and directed over the specific heatsink and out through the fluid aperture 140. In this manner, the pump may be placed in a position within the immersion coolant tank 310 to supply cooler dielectric fluid 322 directly over the specific heatsink.

Figure 4:
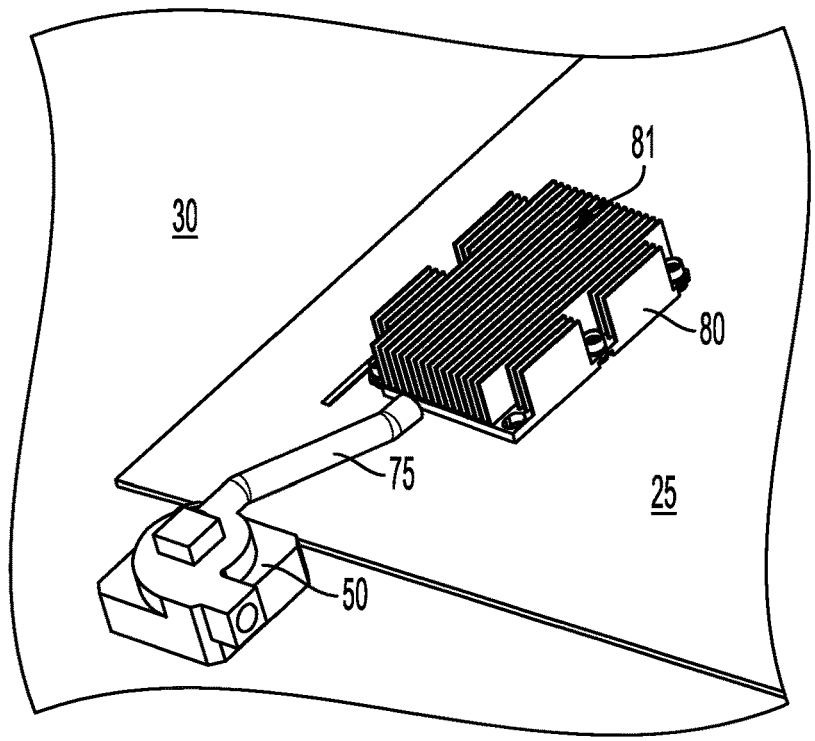
FIG. 4 is a close-up relief view of elements in FIG. 3, but with the coolant shroud removed to reveal a heatsink of the electronic equipment in accordance with various embodiments.

FIG. 4 shows a close-up relief view of elements in FIG. 3, but with the coolant shroud (i.e., 100) removed to reveal a heatsink 80 of the electronic equipment in accordance with various embodiments. The heatsink 80 may include a plurality of fins 81 formed to provide greater surface area for expelling heat. Once inside the cooling chamber of the coolant shroud, dielectric fluid may be made to flow over and between the fins 81, absorbing heat there from. The heatsink 80 typically are mounted on or over heat generating components such as processor units. Such heat generating components may be mounted directly on the mounting surface 25.

Figure 5:
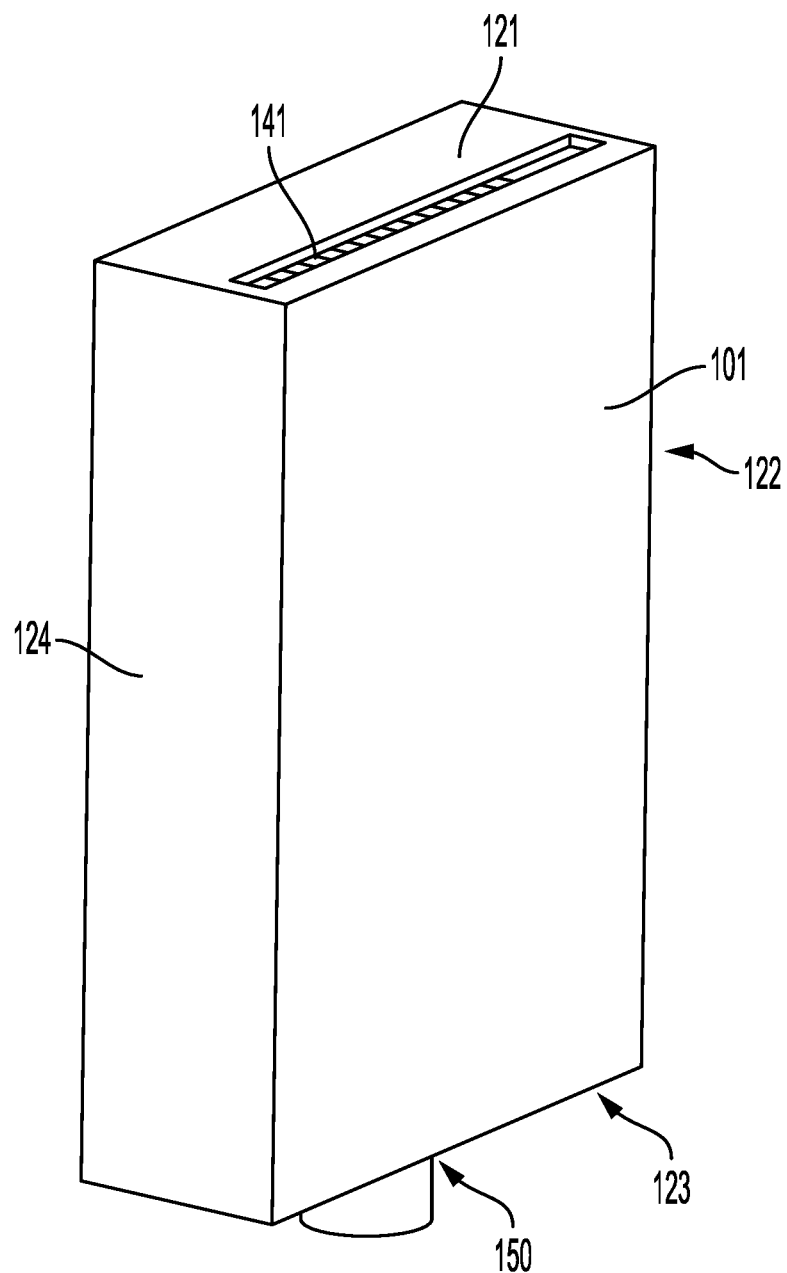
FIG. 5 is a perspective view of a coolant shroud in accordance with various embodiments.

FIG. 5 shows an alternative coolant shroud 101, which includes a fluid aperture 141 disposed on one of the side walls thereof. In particular, the fluid aperture 141 and the fluid port 150 may be disposed on opposite side walls 121, 123. In other embodiments, the fluid aperture 141 may be disposed on side wall 124 and/or 122.

The size, shape, and position of the fluid apertures 140, 141 may have a pronounced effect on the distribution of dielectric fluid flow throughout the cooling chamber of the coolant shroud 100. For example, the coolant shrouds 100, 101 shown in FIGS. 1, 2, and 4 show the fluid apertures 140, 141 close to but not coincident with an edge of the coolant shrouds 140, 141, thus forming a narrow band of shroud between the apertures 140, 141 and the respective edge. Alternatively, that narrow band may be eliminated or reduced substantially. In addition, the fluid apertures 140, 141 are shown as having a rectangular shape, which may promote an even well-distributed flow pattern over the heatsinks. However, alternatively the apertures may have a different shape, such as oval, round, square, triangular, or other less traditional geometric shapes. In addition, if a particular part of a heatsink would benefit from a greater or lesser dielectric fluid flow rates, the apertures 140, 141 could be altered to achieve such flows. For example, one portion of the apertures 140, 141 may be taller or wider than another.

Figure 6:
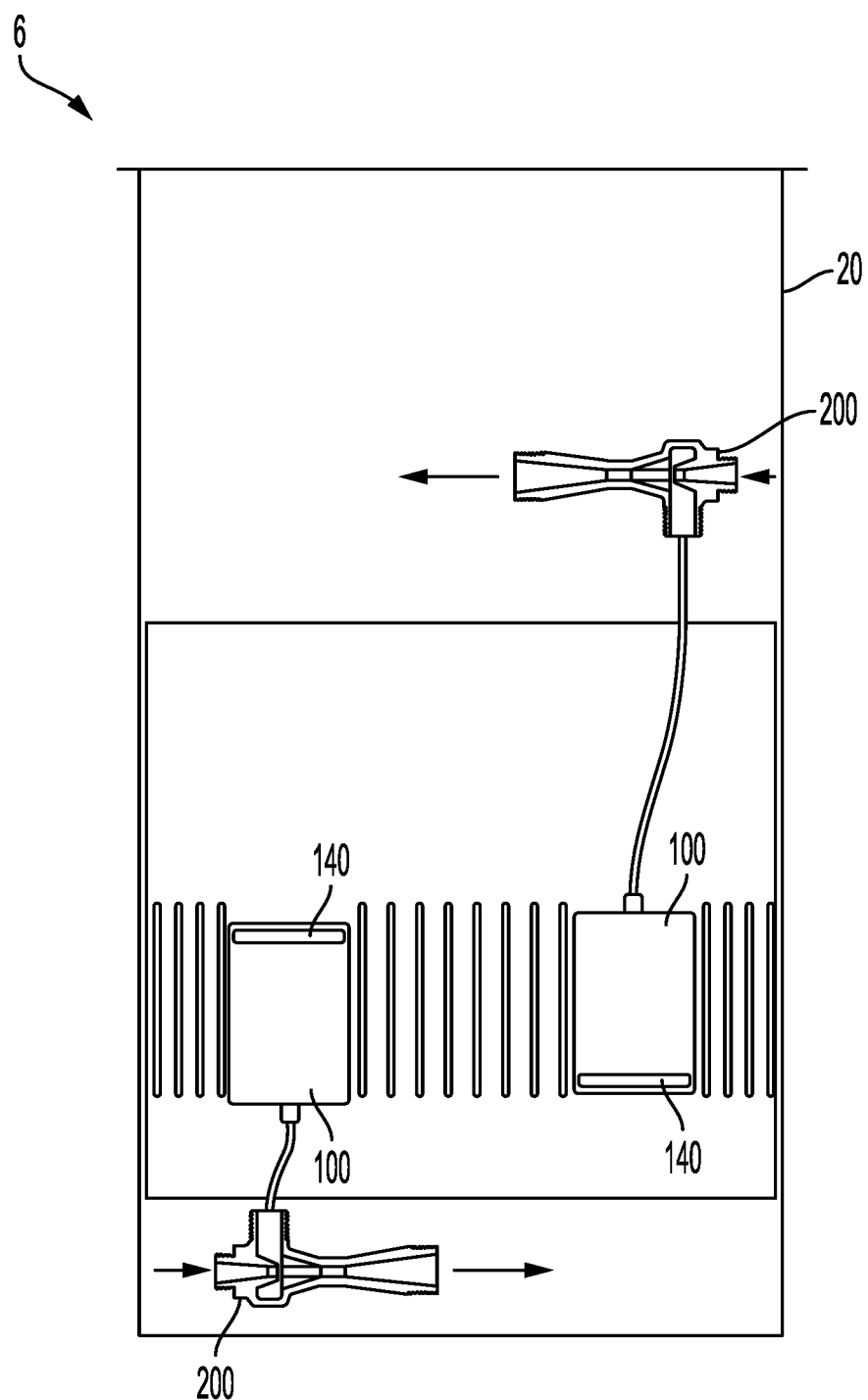
FIG. 6 is a side elevation view of an electronic equipment coolant system with a venturi ejector pump.

FIG. 6 illustrates various aspects of an electronic equipment coolant system 6 with venturi ejector pumps 200 used in combination with the coolant shrouds 100 to cool the heatsink elements, in accordance with various embodiments. The venturi ejector pumps 200 use a motivating flow $F_M$ at relatively high velocity and a relatively low volumetric flow within the body of the venturi ejector pump 200 to create a low-pressure space therein. Such a low-pressure space may be in fluid communication with the fluid port 150 on the shroud via tube 75. This low pressure provides the suction necessary to draw the dielectric fluid into the shroud through aperture 140, across the heatsink, out the fluid port 150, and supply a drawn flow FD of heated dielectric fluid into the venture ejector pump 200. The motivating fluid in the motivating flow $F_M$ and the suction fluid from the drawn flow FD will thus be combined to create and out flow $F_{Out}$, which may be cooler than the suction fluid from the shroud thereby making it more suitable for discharge into the server body 20 for further cooling of other electronic components. The motivating fluid, with its associated motivating flow $F_M$, may be furnished by the pumping system that is also circulating dielectric fluid through the tank. For example, supply tubing 76, which supplies the motivating fluid may draw dielectric fluid from the inlet line (e.g., 340 in FIG. 1) of the immersion coolant tank (e.g., 310 in FIG. 1). The inlet line may feed into a manifold, which may supply multiple supply tubes 76 to each piece of electronic equipment 20 and/or multiple pieces of electronic equipment 20, in addition to the rest of the immersion coolant tank.

In some embodiments, the venturi ejector pumps 200 in the electronic equipment coolant system 6 may be used to enhance circulation of the dielectric fluid within the inner volume 30. An orientation of the venture ejector pumps 200, which dictates a direction of the out flow $F_{Out}$, may be used to cause a recirculating flow, a directional flow out of the casing of the electronic equipment 20, and/or a combination thereof. Such a recirculating flow may help eliminate or reduce stagnation points in the dielectric fluid flow within the inner volume 30.

The foregoing descriptions of systems, devices, and methods are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A coolant shroud for a heatsink of electronic equipment immersed in an immersion coolant tank, comprising:
   side walls configured to be mounted on a mounting surface within the immersion coolant tank and on which the heatsink is secured, wherein the side walls are configured to extend away from the mounting surface, wherein at least one of the side walls includes a fluid port; and
   a covering wall extending from and between the side walls, wherein the side walls and the covering wall together form a cooling chamber configured to receive the heatsink therein, wherein the covering wall includes a fluid aperture separate from the fluid port, wherein dielectric fluid inside the cooling chamber is in fluid communication with dielectric fluid outside the cooling chamber via the fluid aperture, wherein the fluid port is in fluid communication with a dielectric fluid pump disposed outside the cooling chamber such that fluid pressure generated by the dielectric fluid pump is configured to move dielectric fluid through and between each of the fluid aperture and the fluid port.

2. The coolant shroud of claim 1, wherein the fluid aperture is formed as an elongate slot disposed at an opposite end of the covering wall from a side wall of the side walls that includes the fluid port.

3. The coolant shroud of claim 1, further comprising:
   tubing coupling the fluid port to the dielectric fluid pump, wherein the dielectric fluid pump is contained within the immersion coolant tank and remote from the side walls and the covering wall and contained within the immersion coolant tank.

4. The coolant shroud of claim 1, wherein the fluid aperture and the fluid port are configured to enable the dielectric fluid pump to draw dielectric fluid from the immersion coolant tank into the cooling chamber through the fluid aperture for cooling the heatsink and return to the immersion coolant tank via the fluid port.

5. The coolant shroud of claim 1, wherein the fluid aperture and the fluid port are disposed on opposite side walls.

6. The coolant shroud of claim 1, wherein the heatsink is disposed between the covering wall and the mounting surface.

7. The coolant shroud of claim 1, wherein inside the immersion coolant tank, the covering wall is configured to be mounted in a vertical orientation and the fluid port is disposed in a downward facing orientation.

8. An electronic equipment coolant system for a heatsink of electronic equipment immersed in an immersion coolant tank, comprising:
   a coolant shroud comprising:
      side walls configured to be mounted on a mounting surface within the immersion coolant tank and on which the heatsink is secured, wherein the side walls are configured to extend away from the mounting surface, wherein at least one of the side walls includes a fluid port, and
      a covering wall extending from and between the side walls, wherein the side walls and the covering wall together form a cooling chamber configured to receive the heatsink therein, wherein the covering wall includes a fluid aperture separate from the fluid port, wherein dielectric fluid inside the cooling chamber is in fluid communication with dielectric fluid outside the cooling chamber via the fluid aperture; and
   a dielectric fluid pump in fluid communication with the coolant shroud via the fluid port, wherein the dielectric fluid pump is disposed outside the cooling chamber such that fluid pressure generated by the dielectric fluid pump is configured to move dielectric fluid through and between each of the fluid aperture and the fluid port.

9. The electronic equipment coolant system of claim 8, wherein the dielectric fluid pump is a venturi ejector pump configured to receive and combine a motivating fluid flow with a flow of dielectric fluid drawn from the fluid port of the coolant shroud.

10. The electronic equipment coolant system of claim 8, wherein the fluid aperture is formed as an elongate slot disposed at an opposite end of the covering wall from a side wall of the side walls that includes the fluid port.

11. The electronic equipment coolant system of claim 8, further comprising:
   tubing coupling the fluid port of the coolant shroud to the dielectric fluid pump, wherein the dielectric fluid pump is contained within the immersion coolant tank and remote from the side walls and the covering wall and contained within the immersion coolant tank.

12. The electronic equipment coolant system of claim 8, wherein the fluid aperture and the fluid port are configured to enable the dielectric fluid pump to draw dielectric fluid from the immersion coolant tank into the cooling chamber through the fluid aperture for cooling the heatsink and return to the immersion coolant tank via the fluid port.

13. The electronic equipment coolant system of claim 8, wherein the fluid aperture and the fluid port are disposed on opposite side walls.

14. The electronic equipment coolant system of claim 8, wherein the heatsink is disposed between the covering wall and the mounting surface.

15. The electronic equipment coolant system of claim 8, wherein inside the immersion coolant tank, the covering wall is configured to be mounted in a vertical orientation and the fluid port is disposed in a downward facing orientation.

* * * * *